US008005234B2

(12) United States Patent
Takahashi et al.

(10) Patent No.: US 8,005,234 B2
(45) Date of Patent: Aug. 23, 2011

(54) METHOD FOR SYNTHESIZING IMPULSE RESPONSE AND METHOD FOR CREATING REVERBERATION

(75) Inventors: Yoshinori Takahashi, Tokyo (JP); Mikio Tohyama, Tokyo (JP); Hiroaki Fujita, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 1234 days.

(21) Appl. No.: 11/703,309

(22) Filed: Feb. 6, 2007

(65) Prior Publication Data

US 2007/0183602 A1 Aug. 9, 2007

(30) Foreign Application Priority Data

Feb. 8, 2006 (JP) ................................ 2006-031416

(51) Int. Cl.
*H03G 3/00* (2006.01)

(52) U.S. Cl. ........................................... 381/63; 381/61

(58) Field of Classification Search .............. 381/61-63, 381/103-109, 306, 310; 700/94; 84/630, 84/707
See application file for complete search history.

(56) References Cited

U.S. PATENT DOCUMENTS

| | | | | |
|---|---|---|---|---|
| 5,627,899 | A * | 5/1997 | Craven et al. | 381/98 |
| 7,062,337 | B1 * | 6/2006 | Blesser | 700/94 |
| 2004/0223620 | A1 | 11/2004 | Horbach | |

FOREIGN PATENT DOCUMENTS

| | | |
|---|---|---|
| EP | 1017167 | 7/2000 |
| JP | 06-315200 | 11/1994 |
| JP | 09-121400 | 5/1997 |
| JP | 2004-080668 | 3/2004 |

OTHER PUBLICATIONS

Tohyama, et al., "Phase Variabilities and Zeros in a Relevant Transfer Function," The Institution of Electrical Engineers, Stevenage, GB, 1994; Journal of the Acoustical Society of America, vol. 95. No. 1, 1994, pp. 286-296, ISSN 0001-4966 [Online].

Tohyama, et al., "Reverberant Phase in a Room and Zeros in the Complex Frequency Plane," The Institution of Electrical Engineers, Stevenage, GB, 1994; The Journal of the Acoustical Society of America, vol. 89, No. 4, 1991, pp. 1701-1707, ISSN: 0001-4966 [Online].

(Continued)

*Primary Examiner* — Vivian Chin
*Assistant Examiner* — Fatimat O Olaniran
(74) *Attorney, Agent, or Firm* — Morrison & Foerster LLP

(57) ABSTRACT

An impulse response synthesis method is carried out by a dispersion calculation process for calculating a dispersion of phase characteristics in association with a given room based on a volume of the room, a degree of sound absorption of the room, and a distance between a sound source and a receiving point arranged in the room, a noise creation process for creating a noise having the dispersion of the phase characteristics calculated in the dispersion calculation process, a trend addition process for adding a phase trend to the noise created by the noise creation process in accordance with the distance between the sound source and the receiving point and obtaining a phase characteristic of a minimum-phase component from the noise added with the phase trend, and a synthesis process for synthesizing an impulse response based on the phase characteristic of the minimum-phase component, the impulse response being used to create reverberation for the room.

7 Claims, 4 Drawing Sheets

OTHER PUBLICATIONS

Yoshinori Takahashi et al., "The Transfer Function Phase and the Distance From a Sound Source in a 3D Reverberation", The Institute of Electronics, Information and Communication Engineers, Technical Report of IEICE, EA2004-3, SP2004-3 (with English abstract).

Yoshinori Takahashi et al., "Phase Responses of Transfer Functions and Coherent Field in a Reverberation Room", The Institute of Electronics, Information and Communication Engineers, vol. J89-A, No. 4, pp. 291-297 (contents of this paper is discussed in the attached specification).

* cited by examiner

METHOD FOR SYNTHESIZING IMPULSE RESPONSE AND METHOD FOR CREATING REVERBERATION

BACKGROUND OF THE INVENTION

1. Technical Field of the Invention

The present invention relates to a technology for controlling an image of distance in the sense of hearing a sound when an audio signal is reproduced as the sound.

2. Description of the Related Art

A variety of technologies have been suggested to control a sense of the distance to a sound source given to a listener when a sound is reproduced, i.e., to control the distance to the sound source which the listener feels from the reproduced sound. For example, Patent Reference 1 suggests a technology in which an audio signal with a reflected sound component added to a direct sound component is generated through a reflected sound addition circuit, and the sense of distance given to the listener is controlled by adjusting the ratio of levels and the time interval between the direct and reflected sound components. Patent Reference 2 suggests a technology in which two sound reproducing units for direct and indirect sounds are provided and the sense of distance given to the listener is controlled by adjusting the ratio of levels between direct and indirect sounds reproduced by the two sound reproducing units.

[Patent Reference 1] Japanese Patent Application Publication No. Heisei 6(1994)-315200

[Patent Reference 2] Japanese Patent Application Publication No. Heisei 9(1997)-121400

[Patent Reference 3] Japanese Patent Application Publication No. 2004-80668

[Non-Patent Reference 1] The Institute of Electronics, Information and Communication Engineers, Technical Report of IEICE, EA2004-3, SP2004-3 (2004-04), The Transfer Fuction Phase and the Distance from a Sound Source in a 3D Reverberation, Yoshinori TAKAHASHI, Mikio THOYAMA and Takashi MANABE.

The past technologies control the sense of distance given to the listener by adjusting an indirect or reflected sound added to the direct sound component. However, when a sound generated by a sound source is detected at a sound receiving point in a room, the distance between the sound source and the sound receiving point also exerts a great influence on phase characteristics of a minimum-phase component included in the direct sound component detected at the sound receiving point. In the past, there is no technology which takes this fact into consideration in controlling the sense of distance when a sound is reproduced.

SUMMARY OF THE INVENTION

Therefore, the present invention has been made in view of the above circumstances, and it is an object of the present invention to provide a technical means for enabling control of the sense of distance given to the listener using phase characteristics of the minimum-phase component according to a distance between the sound source and the receiving point when an audio signal is reproduced as a sound.

The present invention provides an impulse response synthesis method which is carried out by a dispersion calculation process for calculating a dispersion of phase characteristics in association with a given room based on a volume of the room, a degree of sound absorption of the room, and a distance between a sound source and a receiving point arranged in the room, a noise creation process for creating a noise having the dispersion of the phase characteristics calculated in the dispersion calculation process, a trend addition process for adding a phase trend to the noise created by the noise creation process in accordance with the distance between the sound source and the receiving point and obtaining a phase characteristic of a minimum-phase component from the noise added with the phase trend, and a synthesis process for synthesizing an impulse response based on the phase characteristic of the minimum-phase component, the impulse response being used to create reverberation for the room.

When a sound detected at a sound receiving point in a room is divided into a direct sound and a reverberant sound, the direct sound includes a minimum-phase component and the distance between the sound source and the sound receiving point exerts a great influence on the phase characteristics of the minimum-phase component. The present invention obtains an impulse response with the phase characteristics of the minimum-phase component controlled according to a desired sound source to receiving point distance.

DETAILED DESCRIPTION OF THE INVENTION

Embodiments of the present invention will now be described with reference to the drawings.

Technologies have been commonly used for reproducing a sound corresponding to an audio signal output from a sound source by convolving the audio signal with an impulse response collected in an acoustic space to obtain a sound with a reverberation effect added thereto. An object of this embodiment is to give a listener a sense of distance corresponding to a desired sound source to receiving point distance when reproducing a sound by convolving an audio signal with an impulse response, and more particularly to synthesize an impulse response that allows such a sense of distance to be created when using the impulse response for convolution with the audio signal.

Figure 1:
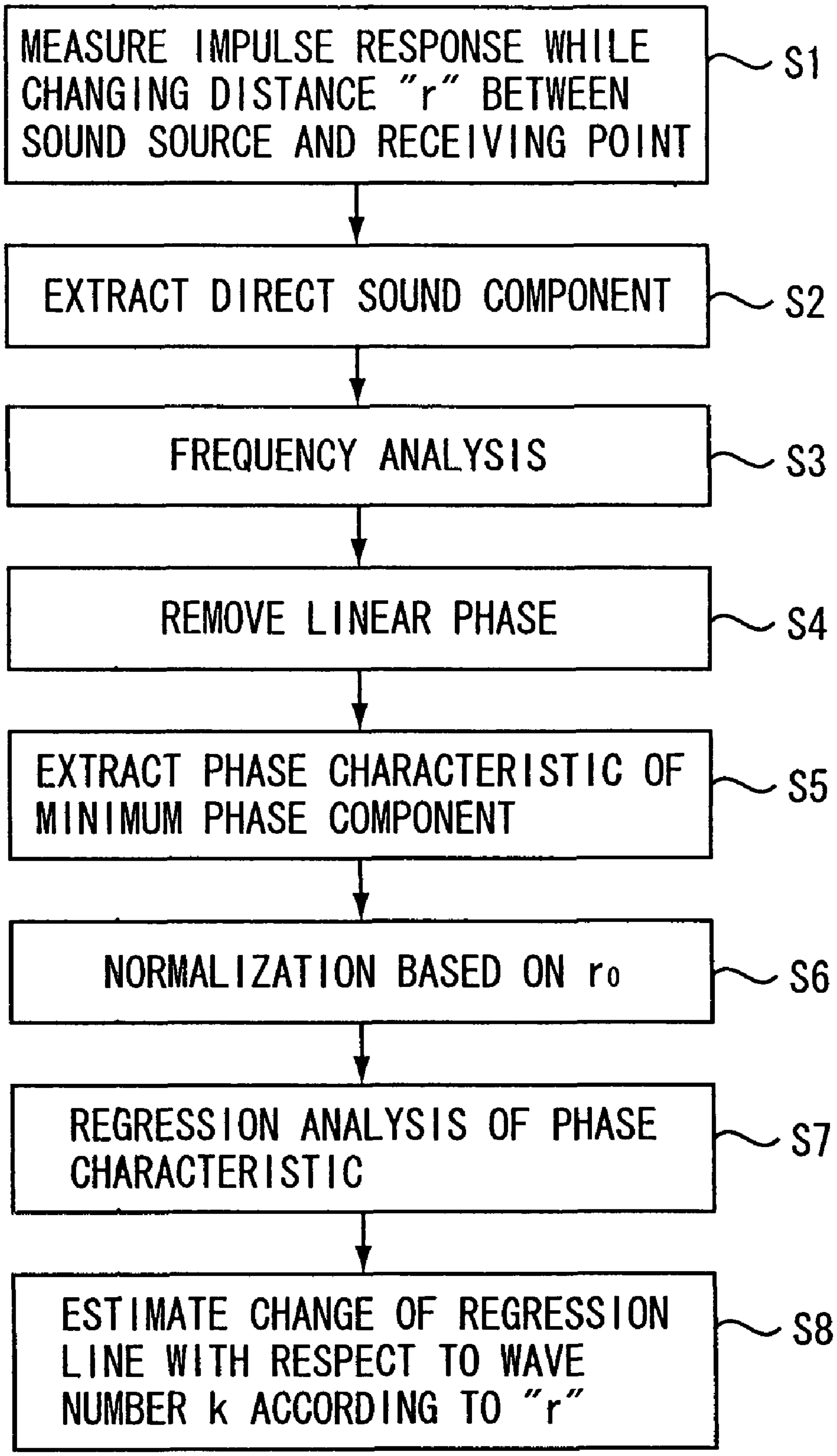
FIG. 1 is a flow chart of a procedure for analyzing phase characteristics of a minimum-phase component of an impulse response.

An impulse response collected in an acoustic space can be divided into a minimum-phase component and an all-pass component. When a sound source installed in a room generates a sound, there are detected a direct sound component that reaches a sound receiving point directly from the sound source and a reverberant sound component that reaches the sound receiving point after reflection on walls of the room. The direct sound component includes a minimum-phase component. Phase characteristics of the minimum-phase component vary depending on the distance between the sound source and the sound receiving point. The dependency of the phase characteristics of the minimum-phase component on the sound source to receiving point distance can be confirmed, for example, through a procedure illustrated in FIG. 1.

First, a sound source and a sound receiving point are arranged in a room and an impulse sound is generated by the sound source. Then, impulse responses are collected at the sound receiving point while changing the distance “r”

between the sound source and the sound receiving point with the sound source fixed (step S1). Then, impulse responses corresponding respectively to the variety of sound source to receiving point distances "r" are each multiplied by, for example, an exponential window that attenuates as time passes, and a direct sound component is extracted from each of the impulse responses (step S2). Then, Fast Fourier Transform (FFT) is performed on each of the direct sound components corresponding respectively to the variety of sound source to receiving point distances "r" to obtain amplitude and phase characteristics of each direct sound component (step S3). A linear phase, which is a component corresponding to delay, is removed from the phase characteristics of each direct sound component (step S4). The phase characteristics of the minimum-phase component are extracted from the phase characteristics of the direct sound component after the removal (step S5).

Figure 2:
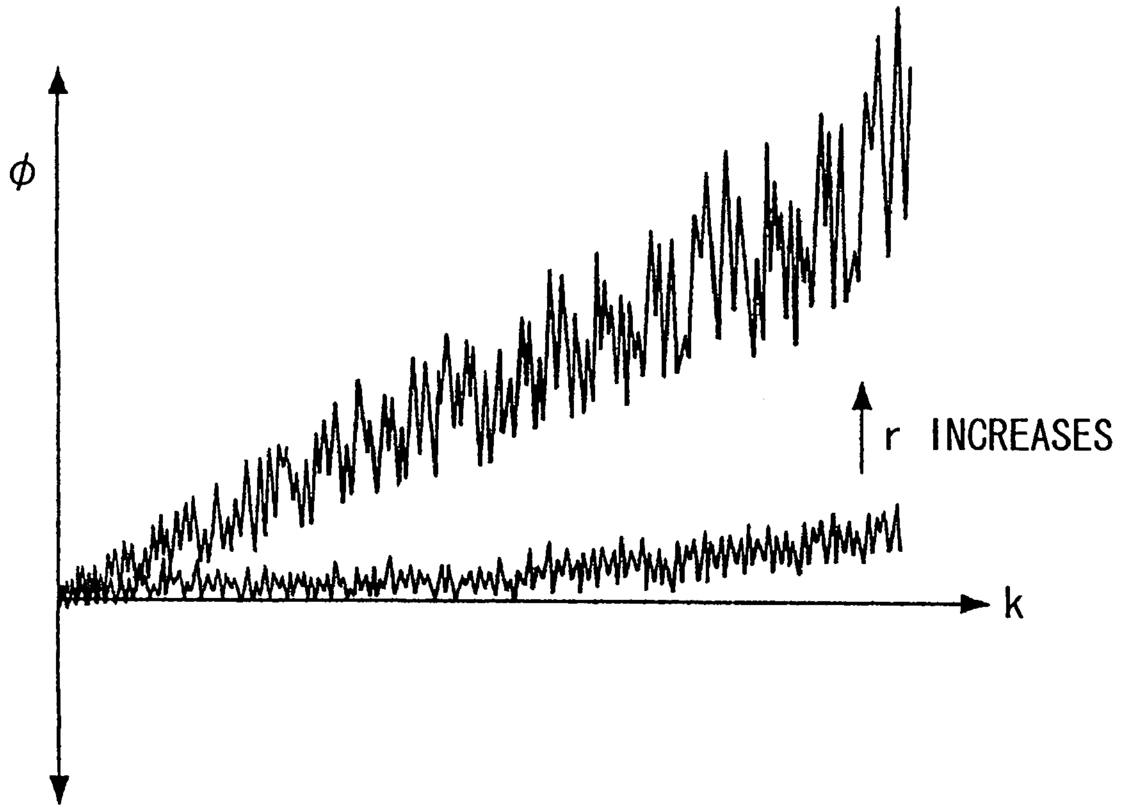
FIG. 2 schematically illustrates how the phase characteristics of the minimum-phase components vary depending on a sound source to receiving point distance.

FIG. 2 schematically illustrates the phase characteristics of the minimum-phase components of impulse responses obtained in this manner. In FIG. 2, the horizontal axis represents a wave number k and the vertical axis represents a phase delay ϕ. As shown in FIG. 2, as the wave number k increases, the phase ϕ of the minimum-phase component increases while fluctuating randomly. Here, as the sound source to receiving point distance "r" increases, the gradient of the phase ϕ with respect to the wave number k increases and the dispersion of the phase ϕ also increases.

The phase characteristics of the minimum-phase components corresponding respectively to the variety of sound source to receiving point distances "r" obtained in the above manner are normalized according to phase characteristics corresponding to the smallest "$r_0$" of the distances "r" (step S6). Regression analysis is performed on each of the normalized phase characteristics corresponding to the variety of sound source to receiving point distances "r" to obtain a straight regression line of the phase ϕ with respect to the wave number k (step S7). A phase trend of the minimum-phase component with respect to the wave number k, namely, a gradient dϕ/dk of the straight regression line of the phase ϕ with respect to the wave number k is obtained and a dependency of the gradient dϕ/dk on a distance "$r-r_0$" is obtained for each of the variety of sound source to receiving point distances "r".

Figure 3:
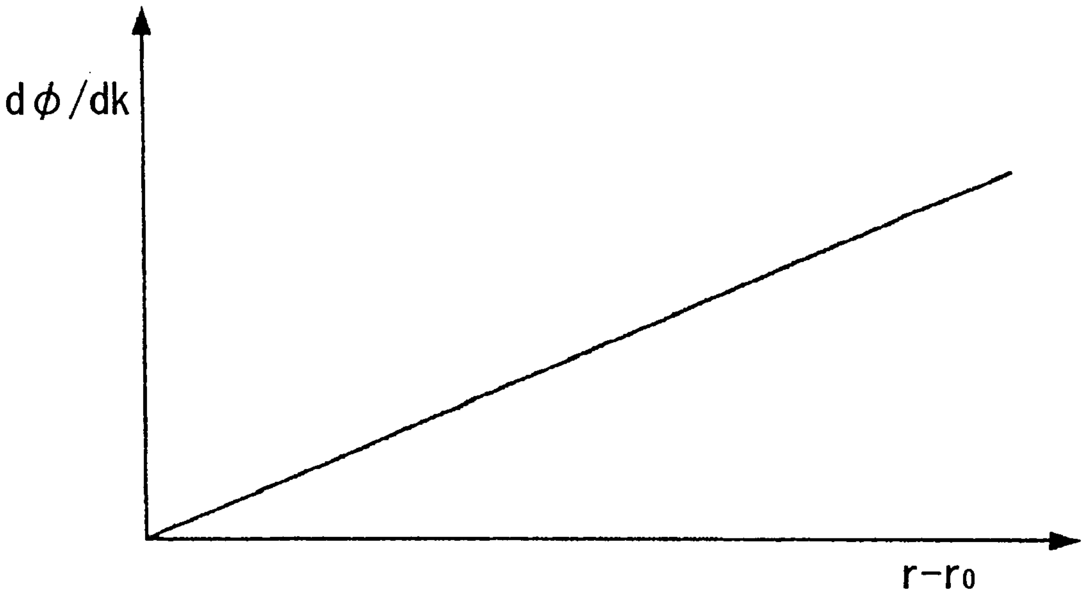
FIG. 3 schematically illustrates the relationship between the sound source to receiving point distance and the gradient of the phase of the minimum-phase component with respect to the wave number.

As schematically illustrated in FIG. 3, the dependency of the gradient dϕ/dk on the distance "$r-r_0$" obtained in this manner is that the gradient dϕ/dk tends to increase as the distance "$r-r_0$" increases. Although the phase trend (i.e., the dependency of the phase ϕ on the wave number k) is approximated by a straight line in this example, the phase trends may be approximated by curves and then the relationship between the curves and the sound source to receiving point distances "r" may be obtained.

More detailed and concrete analysis of the minimum-phase components are described in the following paper: The Institute of Electronics, Information and Communication Engineers, A Vol. J89-A No. 4 pp. 291-297, Phase Responses of Transfer Functions and Coherent Field in a Reverberation Room, Yoshinori TAKAHASHI, Mikio THOYAMA and Yoshio YAMASAKI. All of the contents of this paper is herein incorporated into the specification by referencing thereto.

Figure 4:
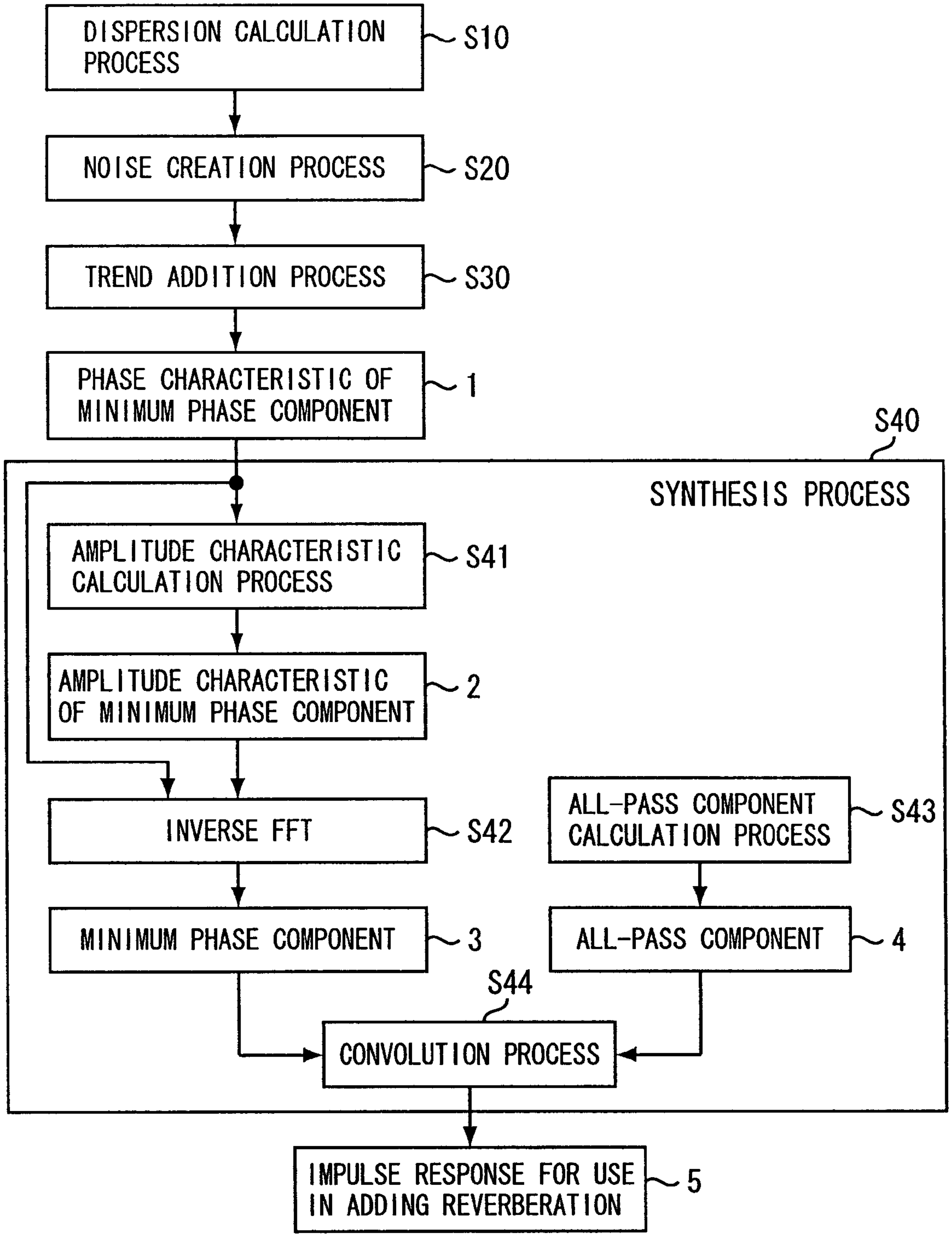
FIG. 4 is a flow chart of an impulse response synthesis method according to an embodiment of the present invention.

An impulse response synthesis method according to this embodiment is based on the above facts. FIG. 4 is a flow chart of an impulse response synthesis method according to this embodiment. In this example, impulse responses of a pair of left and right channels are synthesized taking into consideration stereo playback of a reverberant sound. First, in a dispersion calculation process (step S10), a dispersion σ of phase characteristics is theoretically determined from a desired sound source to receiving point distance "r", a desired room volume, and a desired average degree of sound absorption of the room.

Then, a noise creation process (step S20) is performed. Two normal random sequences X(n) and Y(n) having the same dispersion as the dispersion σ are created. A sequence having a length less than or equal to half of the Discrete Fourier Transform (DFT) length is separated from each of the normal random sequences X(n) and Y(n) of time domain having the dispersion σ and DFT is performed on each separated sequence to create irregular sequences θL(k) and θR(k) of frequency domain. These irregular sequences θL(k) and θR(k) are selected as a noise component (dispersed part) of the phase characteristics. When impulse responses of two channels are synthesized as in this example, two normal random sequences X(n) and Y(n) may be created so as to have a two ear correlation.

Then, a trend addition process (step S30) is performed. In this trend addition process, respective group delay characteristics dθ/dω (ω: angular frequency) are obtained for the noise components (θL(k) and θR(k)) of two channels obtained in the noise creation process. Then, a previously obtained phase trend corresponding to a desired sound source to receiving point distance "r" is given (added) to each group delay characteristic dθ/dω. That is, in a coordinate system with a horizontal axis representing ω and a vertical axis representing dθ/dω, a graph of dθ/dω increases and decreases according to the phase trend. Here, when the phase trend of the minimum-phase component with respect to the wave number is approximated by a straight line, a value corresponding to a phase gradient dϕ/dk corresponding to a desired sound source to receiving point distance "r" is added as the phase trend to the group delay characteristic dθ/dω. The group delay characteristic dθ/dω to which the phase trend has been added is integrated with respect to ω to calculate a phase characteristic "1" of the-minimum-phase component to which the phase trend corresponding to the sound source to receiving point distance "r" has been added.

Then, a synthesis process (step S40) is performed to generate impulse responses "5" of two channels for use in a convolution calculation for adding reverberation using the phase characteristics "1" of the minimum-phase components of two channels.

The following is a more detailed description of step S40. First, in an amplitude characteristic calculation process (step S41), amplitude characteristics "2" of the minimum-phase components of two channels are calculated using phase characteristics "1" of the minimum-phase components of two channels. One method that can be considered to calculate the amplitude characteristics (for example, see Patent Reference 3) uses a minimum-phase condition that natural logarithm of the amplitude characteristics and the phase characteristics become a Hilbert transform pair. Then, for each channel, inverse FFT is performed using the amplitude characteristics "2" and the phase characteristics "1" of the minimum-phase components to obtain minimum-phase components "3" of two channels (step S42).

In an all-pass component calculation process (step S43), white noise is multiplied by an exponential time attenuation window corresponding to a desired reverberation time (the window is $e^{-t/\tau}$ when the reverberation time is τ) and the multiplied result is set as an all-pass component "4" of the impulse response. Then, in a convolution process (step S44), the all-pass component "4" is convolved with each of the minimum-phase components "3" of the impulse responses of two channels to obtain impulse responses "5" of two channels.

The impulse responses of two channels obtained in this manner are convolved with an audio signal output from a sound source. Audio signals of the two (right and left) channels obtained through this convolution are reproduced through speakers of the two (right and left) channels. In the above manner, sounds with the phase characteristics of the minimum-phase component adjusted according to a desired sound source to receiving point distance "r" are provided to a listener, thereby giving the listener a sense of distance corresponding to the sound source to receiving point distance "r".

While the present invention has been described with reference to the above embodiment, the present invention can also provide other embodiments. The following are examples.

(1) Although the minimum-phase component is converted into a time-domain signal and it is then convolved with an all-pass component as a time-domain signal in the above embodiment, the minimum-phase component may be synthesized with the all-pass component in frequency domain. Specifically, first, after an all-pass component of the impulse response is calculated by multiplying-white noise by an exponential time attenuation window according to a desired reverberation time, and FFT is performed on the all-pass component to obtain amplitude and phase characteristics of the all-pass component. Then, amplitude and phase characteristics of the impulse response are calculated through a multiplication process using the amplitude and phase characteristics of the all-pass component and the amplitude and phase characteristics of the minimum-phase component. Inverse FFT is then performed using the amplitude and phase characteristics of the impulse response to calculate an impulse response to be used for adding reverberation.

(2) Although the above embodiment is exemplified by synthesis of an impulse response for use in stereo playback, an impulse response for use in mono playback may be synthesized. In this case, a noise component of one channel is created in the noise creation process (step S20) and calculation for one channel is performed in each of the subsequent processes.

(3) A program for performing the impulse response synthesis method according to the above embodiment may be installed on an effector apparatus so as to synthesize an impulse response for convolution with an audio signal upon receiving a request to add reverberation or the like. For example, when the user manipulates an operating portion of the effector to input parameters such as a desired room volume, a desired average degree of sound absorption of the room, a desired sound source to receiving point distance, and a reverberation time, the effector adds reverberation to an audio signal from a sound source by synthesizing an impulse response using the input parameters according to the impulse response synthesis method according to the above embodiment and then convolving the impulse response with the audio signal from the sound source.

Figure 5:
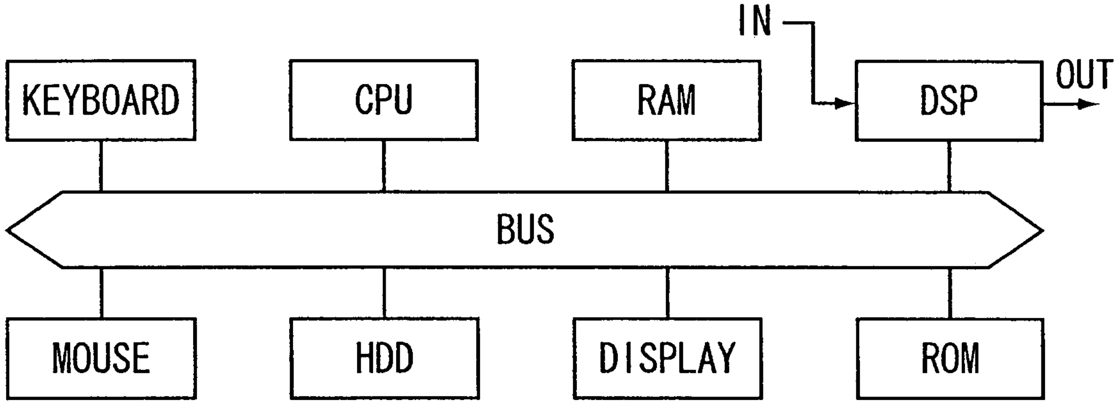
FIG. 5 is a block diagram showing an effector apparatus according to the invention.

FIG. 5 shows an effector apparatus constructed according to the invention. The effector apparatus is composed of CPU, RAM, ROM, HDD (Hard Disk Drive), Keyboard, Mouse, Display and DSP, all connected to a bus. The inventive effector apparatus is designed for applying a reverberation effect to an audio signal, and comprises an input device, a processing device and an output device. The input device includes the keyboard and mouse tool for inputting reverberation parameters in association with a given room, including a volume of the room, a degree of sound absorption of the room, and a distance between a sound source and a receiving point arranged in the room. The processing device is CPU that sequentially performs a dispersion calculation process for calculating a dispersion of phase characteristics in association with the room based on the inputted reverberation parameters, a noise creation process for creating a noise having the dispersion of the phase characteristics calculated in the dispersion calculation process, a trend addition process for adding a phase trend to the noise created by the noise creation process in accordance with the distance between the sound source and the receiving point and obtaining a phase characteristic of a minimum-phase component from the noise added with the phase trend, and a synthesis process for synthesizing an impulse response based on the phase characteristic of the minimum-phase component. The output device is provided in the form of DSP that applies a reverberation effect to an input audio signal obtained from the sound source by convolving the audio signal with the synthesized impulse response.

Figure 6:
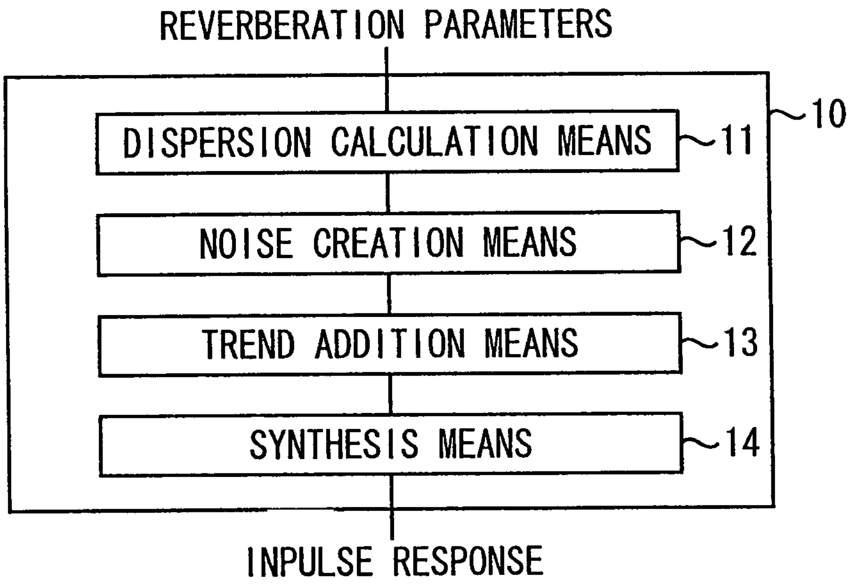
FIG. 6 is a functional block diagram of a processing device contained in the effector apparatus according to the invention.

FIG. 6 is a functional block diagram of the processing device (Central Processing Unit) contained in the effector apparatus according to the invention. The processing device 10 receives the reverberation parameters and outputs the impulse response for use in creating the reverberation effect. The processing device 10 is functionally comprised of dispersion calculation means 11 for calculating a dispersion of phase characteristics in association with the room based on the inputted reverberation parameters, noise creation means 12 for creating a noise having the dispersion of the phase characteristics calculated in the dispersion calculation means 11, trend addition means 13 for adding a phase trend to the noise created by the noise creation means 12 in accordance with the distance between the sound source and the receiving point and obtaining a phase characteristic of a minimum-phase component from the noise added with the phase trend, and synthesis means 14 for synthesizing the impulse response based on the phase characteristic of the minimum-phase component.

HDD or ROM of the effector apparatus is a machine readable medium containing program instructions executable by a computer, i.e., CPU for performing the inventive impulse response synthesis method which comprises the dispersion calculation process for calculating a dispersion of phase characteristics in association with a given room based on a volume of the room, a degree of sound absorption of the room, and a distance between a sound source and a receiving point arranged in the room, the noise creation process for creating a noise having the dispersion of the phase characteristics calculated in the dispersion calculation process, the trend addition process for adding a phase trend to the noise created by the noise creation process in accordance with the distance between the sound source and the receiving point and obtaining a phase characteristic of a minimum-phase component from the noise added with the phase trend, and the synthesis process for synthesizing an impulse response based on the phase characteristic of the minimum-phase component, the impulse response being used to create reverberation for the room.

The invention claimed is:

1. An impulse response synthesis method comprising:

a dispersion calculation process for calculating a dispersion of phase characteristics in association with a given room based on a volume of the room, a degree of sound absorption of the room, and a distance between a sound source and a receiving point arranged in the room;

a noise creation process for creating a noise having the dispersion of the phase characteristics calculated in the dispersion calculation process;

a trend addition process for adding a phase trend to the noise created by the noise creation process in accordance with the distance between the sound source and the receiving point, and obtaining a phase characteristic of a minimum-phase component of the impulse response from the noise added with the phase trend; and a synthesis process for synthesizing an impulse response based on the phase characteristic of the minimum-phase component, the impulse response being used to create reverberation for the room.

2. The impulse response synthesis method according to claim 1, wherein the synthesis process comprises:

a process for calculating an amplitude characteristic of the minimum-phase component from the phase characteristic of the minimum-phase component;

a process for calculating the minimum-phase component of the impulse response from the amplitude characteristic of the minimum-phase component and the phase characteristic of the minimum-phase component;

a process for calculating an all-pass component of the impulse response by multiplying a white noise with an exponential time attenuation window corresponding to a desired reverberation time; and a process for synthesizing the impulse response by convolving the minimum-phase component of the impulse response with the all-pass component of the impulse response.

3. The impulse response synthesis method according to claim 1, wherein the synthesis process comprises:

a process for calculating an amplitude characteristic of the minimum-phase component from the phase characteristic of the minimum-phase component;

a process for calculating an all-pass component of the impulse response by multiplying a white noise with an exponential time attenuation window corresponding to a desired reverberation time;

a process for calculating an amplitude characteristic and a phase characteristic of the all-pass component;

a process for calculating an amplitude characteristic and a phase characteristic of the impulse response from the amplitude characteristic and phase characteristic of the minimum-phase component, and the amplitude characteristic and phase characteristic of the all-pass component; and a process for calculating the impulse response from the amplitude characteristic and the phase characteristic of the impulse response.

4. The impulse response synthesis method according to claim 1, wherein the noise creation process creates respective noises for a pair of a right channel and a left channel having a correlation therebetween in accordance with the distance between the sound source and the receiving point, the trend addition process obtains respective phase characteristics of the minimum-phase components of the right and left channels from the respective noises of the right and left channels added with respective phase trends, and the synthesis process synthesizes the respective impulse responses of the left and right channels with using the respective minimum-phase components of the left and right channels.

5. A method of applying a reverberation effect to an audio signal, comprising:

a dispersion calculation process for calculating a dispersion of phase characteristics in association with a given room based on a volume of the room, a degree of sound absorption of the room, and a distance between a sound source and a receiving point arranged in the room;

a noise creation process for creating a noise having the dispersion of the phase characteristics calculated in the dispersion calculation process;

a trend addition process for adding a phase trend to the noise created by the noise creation process in accordance with the distance between the sound source and the receiving point, and obtaining a phase characteristic of a minimum-phase component of an impulse response from the noise added with the phase trend;

a synthesis process for synthesizing an impulse response based on the phase characteristic of the minimum-phase component; and a convolution process for applying a reverberation effect to an audio signal obtained from the sound source by convolving the audio signal with the synthesized impulse response.

6. A non-transitory machine readable medium containing program instructions executable by a computer for performing an impulse response synthesis method which comprises:

a dispersion calculation process for calculating a dispersion of phase characteristics in association with a given room based on a volume of the room, a degree of sound absorption of the room, and a distance between a sound source and a receiving point arranged in the room;

a noise creation process for creating a noise having the dispersion of the phase characteristics calculated in the dispersion calculation process;

a trend addition process for adding a phase trend to the noise created by the noise creation process in accordance with the distance between the sound source and the receiving point, and obtaining a phase characteristic of a minimum-phase component of an impulse response from the noise added with the phase trend; and a synthesis process for synthesizing an impulse response based on the phase characteristic of the minimum-phase component, the impulse response being used to create reverberation for the room.

7. An effector apparatus for applying a reverberation effect to an audio signal, comprising:

an input device that inputs reverberation parameters in association with a given room, including a volume of the room, a degree of sound absorption of the room, and a distance between a sound source and a receiving point arranged in the room;

a processing device that sequentially performs a dispersion calculation process for calculating a dispersion of phase characteristics in association with the room based on the inputted reverberation parameters, a noise creation process for creating a noise having the dispersion of the phase characteristics calculated in the dispersion calculation process, a trend addition process for adding a phase trend to the noise created by the noise creation process in accordance with the distance between the sound source and the receiving point and obtaining a phase characteristic of a minimum-phase component of an impulse response from the noise added with the phase trend, and a synthesis process for synthesizing an impulse response based on the phase characteristic of the minimum-phase component; and an output device that applies a reverberation effect to an audio signal obtained from the sound source by convolving the audio signal with the synthesized impulse response.

* * * * *